United States Patent [19]

Seki

[11] 4,258,406
[45] Mar. 24, 1981

[54] PROTECTING CIRCUIT

[75] Inventor: Kunio Seki, Hinode, Japan

[73] Assignee: Hitachi, Ltd., Japan

[21] Appl. No.: 52,208

[22] Filed: Jun. 26, 1979

[30] Foreign Application Priority Data

Jul. 7, 1978 [JP] Japan ................................. 53-81903

[51] Int. Cl.³ ........................................... H02H 7/20
[52] U.S. Cl. ..................................... 361/79; 330/298; 330/207 P
[58] Field of Search ............... 361/79; 330/207 P, 298

[56] References Cited

U.S. PATENT DOCUMENTS

| | | | |
|---|---|---|---|
| 3,786,364 | 1/1974 | Wheatley, Jr. ....................... | 330/298 |
| 4,074,334 | 2/1978 | D'Arrigo et al. ............ | 330/207 P X |
| 4,157,513 | 6/1979 | Ghiringhelli et al. ....... | 330/207 P X |

Primary Examiner—Harry E. Moose, Jr.
Attorney, Agent, or Firm—Craig & Antonelli

[57] ABSTRACT

A first resistor and a second resistor are connected in series across the collector and emitter of a transistor that is to be protected thereby to detect a voltage across the collector and emitter thereof, as well as to detect a collector current or an emitter current thereof, and a third resistor is connected to be collector or the emitter of the transistor that is to be protected. A detector transistor is driven by a voltage produced across the second and third transistors. A fourth resistor is connected between the collector and the base of the detector transistor, one end of the fourth resistor connected to the base of the detector transistor being connected to a constant-current circuit, and the other end of the fourth resistor connected to the collector of the detector transistor being connected to the base of a control transistor. The emitter of the control transistor is connected to the collector or the emitter of the transistor that is to be protected via the third resistor. The collector of the control transistor directly or indirectly controls the base current of the transistor that is to be protected.

6 Claims, 6 Drawing Figures

PROTECTING CIRCUIT

BACKGROUND OF THE INVENTION

The present invention relates to a protecting circuit, and more specifically to a protecting circuit of the type of ASO (Area of Safety Operation).

Output power transistors used, for example, in a transistor power amplifier circuit must be operated within an ASO region so that permanent second breakdown is not developed in the collector/emitter voltage $V_{CE}$-collector current $I_c$ characteristics. If the operation of the transistor falls out of the ASO region, the transistor develops second breakdown and is permanently destroyed.

FIG. 3 shows a protecting circuit of the type of ASO for restricting the operation of the transistor within the ASO region to protect the transistor from permanently destroyed, as has been disclosed, for example, in Japanese Utility Model Laid-Open No. 51-101752. The operating condition of an output transistor $Q_4$ is detected by a detector circuit made up of resistors $R_1$, $R_2$ and $R_3$. The detection output of the detector circuit is applied to the base of a control transistor $Q_1$ which controls a base current of the output transistor $Q_4$. In case the operation of the output transistor $Q_4$ is likely to fall outside the ASO region, the control transistor $Q_1$ is rendered conductive thereby to limit the base current of the output transistor $Q_4$. According to the above prior art, however, the forward voltage $V_{BE}$ at the base-emitter junction of the control transistor $Q_1$ has been set to be equal to a threshold voltage at which the protecting circuit commences the protecting operation. Therefore, there arise such defects that the level of protecting operation is varied since the junction voltage across the base and emitter is dependent upon the temperature, or the level at which the protecting operation commences is greatly dispersed due to the dispersion in current amplification factor $h_{FE}$ of the control transistor $Q_2$ or due to the dispersion in the base layer resistance $r_{bb}$.

Japanese Patent Laid-Open No. 50-81247 discloses another protecting circuit of the ASO type as diagramatized in FIG. 4.

As has been disclosed in the above Laid-Open specification, a collector current I of an output transistor $Q_4$ of the circuit is found from the following equation (1), $$I = \frac{kT}{qR_2'} \ln\left(\frac{I_1 R_1'}{V_{CE} - V_{BEQD}}\right) \quad (1)$$

In this circuit, a voltage $V_{BEQD}$ across the base and emitter of a transistor $Q_D$ which equivalently operates as a diode when a circuit of collector and base is short-circuited, is smaller than a voltage $V_{CE}$ across the collector and emitter of the output transistor $Q_4$. Therefore, the voltage $V_{BEQD}$ is negligible. Thus, it is possible to reduce the effects upon the dispersion of element constants or upon the change in temperature (especially, it is possible to reduce the effects caused by the temperature dependency of the forward voltage at the base/emitter junction of the transistors).

According to the abovementioned prior art, however, since the power-limiting equation (1) assumes a curve of exponential function, it becomes very difficult to design the circuit which corresponds to a curve of allowable power loss of the collector of the output transistor $Q_4$ or which corresponds to the ASO region.

Through the research conducted by the inventors of the present invention, on the other hand, it become obvious that the power-limiting equation (1) which describes a curve of exponential function is disadvantageous because of the reasons mentioned below.

In a push-pull output amplifier circuit which operates on a power-supply voltage $V_{cc}$ of positive polarity to drive a load resistance $R_L$ via an output coupling capacitor, the two output transistors which are connected in series between the power-supply voltage $V_{cc}$ and a ground potential GND are usually biased in a d-c manner such that the voltage across the collector and emitter of each of the transistors is about $V_{cc}/2$. Therefore, when an output voltage swing is raised and lowered in response to the input signals with the d-c operation level of $V_{cc}/2$ as a center, and when the input signals do not cause the voltage to rise to the power-supply voltage $V_{cc}$ and do not, either, cause the voltage to lower to the ground potential GND, the output of the push-pull amplifier circuit acquires a non-clipped state. Under the non-clipped output condition, the locus of operation determined by the collector/emitter voltage $V_{CE}$-collector current I characteristics of a single output transistor does not exceed a straight line connecting the two operation points $[O(V), V_{cc}\cdot 2R_L(A)]$ and $[V_{CC}(V), O(A)]$.

On the other hand, when excessive input signals are applied, the two output transistors are alternately rendered conductive and nonconductive responsive to the input signals. Therefore, the output of the push-pull output amplifier circuit is raised up to the power-supply voltage $V_{cc}$ and is lowered to the ground potential GND responsive to the input signals, thereby to produce pulse waveforms clipped between the upper and lower levels. Under the clipped condition, the two transistors perform switching operations between the two levels, i.e., between the power-supply voltage $V_{cc}$ and the ground potential GND. However, the locus of operation of a single output transistor under the clipped output condition caused by excessive input signals, does not exceed a straight line connecting the two operation points $[O(V), V_{cc}/R_L(A)]$ and $[V_{cc}(V), O(A)]$.

Particularly, with the audio output amplifier having small outputs (10 watts to 20 watts), it is desired not to operate the protecting circuit even under clipped output conditions caused by excessive inputs. Namely, when the protecting circuit is operated, a negative feedback loop is established to connect the output and the input of the output transistor, giving rise to the occurrence of oscillation phenomenon or causing the output to be extremely distorted.

In the audio output amplifiers, therefore, it is desired that the ASO characteristics lie between maximum allowable power loss characteristics (hyperbola) of the collector of the output transistor and the abovementioned operation locus (straight line) under the clipped output condition. Therefore, according to the prior art as shown in FIG. 4, the power-limiting equation (1) describes a curve of exponential function, causing the design of the circuit to be complicated.

Further, referring to the power-limiting equation (1), even when a resistor $R_2'$ is constituted by an equivalent resistance of an aluminum wiring layer in a monolithic semiconductive integrated circuit to have a resistance of about 20 m$\Omega$, the resistance of the resistor $R_1'$ must be set to a considerably great value in order to obtain a limiting current of about 2 amperes. Hence, there remains such a problem that the dispersion in the resistance of the resistor $R_1$ greatly affects the limiting current.

In order to preclude the abovementioned problems, the present invention provides a protecting circuit of the ASO type.

SUMMARY OF THE INVENTION

The object of the present invention therefore is to provide a protecting circuit having linear protection initiating characteristics corresponding to a linear operation locus defined by the collector/emitter voltage $V_{CE}$-collector current $I_c$ characteristics of a transistor, like output transistors of a push-pull output amplifier circuit.

In order to achieve the abovementioned object, the fundamental setup of the present invention consists of a detector circuit made up of a resistor for detecting the collector current or emitter current of the transistor that is to be protected, and voltage-dividing resistors for detecting the voltage across the collector and emitter, whereby the detection output is applied to a control transistor via an emitter-collector path of a transistor having a resistor across the collector and base thereof.

The invention is concretely mentioned below by way of Examples.

DESCRIPTION OF THE PREFERRED EMBODIMENTS

Figure 1:
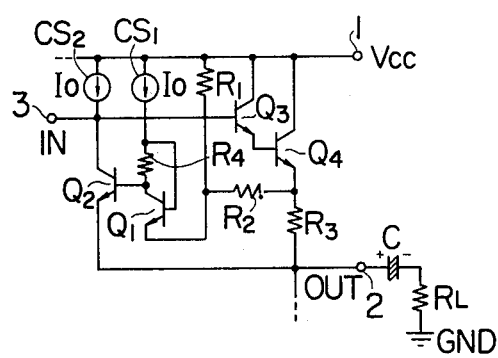
FIG. 1 is a circuit diagram of a protecting circuit according to an embodiment of the present invention.
Figure 3:
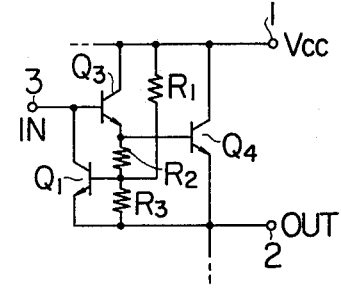
FIG. 3 and 4 are diagrams showing conventional protecting circuits.

FIG. 1 is a circuit diagram of an ASO-type protecting circuit according to an embodiment of the present invention.

In FIG. 1, symbol $Q_4$ represents an output transistor that is to be protected. A transistor $Q_3$ placed in a preceding stage with respect to the transistor $Q_4$ and is Darlington-connected therewith, works to drive the above-mentioned output transistor $Q_4$.

A constant-current circuit $CS_2$ connected to the base of the transistor $Q_3$ constitutes a load for a drive circuit (not shown) which drives the output transistors $Q_3$ and $Q_4$.

A resistor $R_3$ inserted between the emitter of the output transistor $Q_4$ and an output terminal 2 works to detect an emitter current which is nearly equal to a collector current of the output transistor $Q_4$. Further, resistors $R_1$ and $R_2$ connected in series between the collector and the emitter of the output transistor $Q_4$ work to detect a voltage across the collector and the emitter thereof.

A voltage at a connection point between the resistor $R_1$ and the resistor $R_2$ is applied to the emitter of a transistor $Q_1$. A resistor $R_4$ is inserted between the base and the collector of the transistor $Q_1$. A constant current $I_o$ is allowed to flow through the resistor $R_4$ from the constant-current circuit $CS_1$.

The abovementioned resistors $R_1$, $R_2$, $R_3$, $R_4$ and the transistor $Q_1$, constitute a detector circuit for detecting the operating condition of the output transistor $Q_4$ that is to be protected.

The output of the detector circuit obtained at the collector of the transistor $Q_1$ is applied to the base of a control transistor $Q_2$. Consequently, the collector of the control transistor $Q_2$ works to control the base current of the output transistor $Q_4$.

In the thus constructed detector circuit, the level of the voltage applied to the emitter of the detector transistor $Q_1$ is increased by the emitter-base junction, decreased by the resistor $R_4$ and constant current $I_0$, and is applied to the base of the control transistor $Q_2$. The forward voltage between the base and emitter of the transistor $Q_2$ is as small as about 0.6 volt. Therefore, the resistors $R_1$ to $R_3$ are so selected as to satisfy the following relation (2)

$$R_1 >> R_2 >> R_3 \tag{2}$$

To satisfy the above relation (2), the resistances of resistors $R_1$, $R_2$ and $R_3$ have been selected to be 10.7 kΩ, 100Ω, and 15 m Ω(0.015Ω).

Hence, the voltage $V_{BEQ2}$ appearing across the base and emitter of the transistor $Q_2$ can be approximately given by the following relation (3).

$$V_{BEQ2} = I_{c4} \cdot R_3 = \frac{R_2}{R_1 + R_2} V_{CEQ4} + I_o \cdot R_2 + V_{BEQ1} - I_o \cdot R_4 \tag{3}$$
$$\approx I_{c4} \cdot R_3 + \frac{R_2}{R_1} V_{CEQ4} + I_o(R_2 - R_4) + V_{BEQ1}$$

where $I_{c4}$ represents an emitter current of the output transistor $Q_4$, $V_{CEQ4}$ a voltage across the collector and emitter of the output transistor $Q_4$, and $V_{BEQ1}$ a forward voltage across the base and emitter of the transistor $Q_1$.

When the voltage-current characteristics at the base-emitter junction of the transistors $Q_1$ and $Q_2$ are brought into agreement with each other, the control transistor $Q_2$ is rendered conductive to reduce the base current of the output transistor $Q_4$ so that the protecting circuit exhibits the protecting operation only when the forward voltages $V_{BEQ1}$ and $V_{BEQ2}$ across the base and emitter of transistors $Q_1$ and $Q_2$ satisfy the relation $V_{BEQ2} > V_{BEQ1}$. Therefore, the current-limiting equation of the protecting circuit of the embodiment of FIG. 1, i.e., the condition by which the protecting circuit commences the protecting operation, can be given by the following relations (4) and (5), $$R_3 I_{c4} + \frac{R_2}{R_1} V_{CEQ4} + I_o(R_2 - R_4) > 0 \tag{4}$$

$$\therefore I_{c4} \frac{R_2 - R_4}{R_3} I_o - \frac{R_2}{R_1 \cdot R_3} V_{CEQ4} \tag{5}$$

Here, if the constant current $I_o$ of the constant-current circuit $CS_1$ is set to be $I_o = V_{cc}/R_1$, and the resistors $R_2$ and $R_4$ are so set as to be $R_4 = 2R_2$ (for instance, $R_2 = 100Ω$, $R_4 = 200Ω$), the above relation (5) can be simplified as follows (here, $V_{cc}$ represents a power-supply voltage applied to a power-supply terminal 1), $$I_{c4} = \frac{R_2}{R_1 \cdot R_3} (Vcc - V_{CEQ4}) \quad (6)$$

Figure 5:
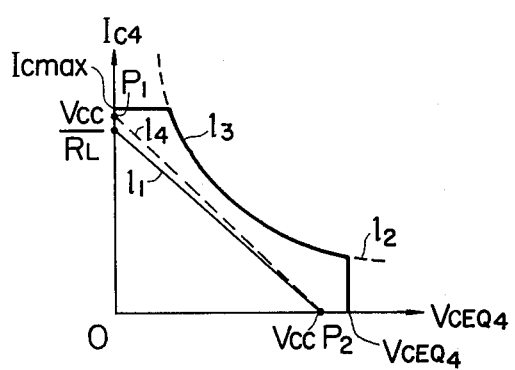
FIG. 5 shows protecting operation initiating characteristics of the protecting circuit of the present invention.

In either of the relation (5) or (6), therefore, a straight line l₄ connecting two operation points $P_1$ and $P_2$ on the collector-emitter voltage $V_{CEQ4}$-collector current $I_{c4}$ characteristics of the output transistor $Q_4$, represents a line for commencing the protecting operation as shown in FIG. 5.

For example, in the case of the relation (5), the two operation points $P_1$ and $P_2$ are located at $$\left[ O(V), \frac{R_2 - R_4}{R_3} \cdot I_o(A) \right] \text{ and } \left[ \frac{R_1(R_2 - R_4)}{R_2} I_o(V), O(A) \right],$$

respectively. In the case of the relation (6), on the other hand, the two operation points $P_1$ and $P_2$ are located at $$\left[ O(V), \frac{R_2}{R_1 \cdot R_3} Vcc(A) \right]$$

and [Vcc(V), O(A)], respectively.

Further, as shown in FIG. 5, the operation point $P_1$ is set to be smaller than a maximum allowable collector current Icmax of the output transistor $Q_4$ but is greater than Vcc/$R_L$, and the operation point $P_2$ is set to a value Vcc which is smaller than a breakdown voltage $BV_{CEQ4}$ across the collector and emitter of the output transistor $Q_4$.

As mentioned already, the operation locus $l_1$ of the output transistor $Q_4$ of the push-pull output amplifier circuit which operates on the positive power-supply voltage Vcc, does not exceed a straight line connecting the points [O(V), Vcc/$R_L$(A)] and [Vcc(V), O(A)] shown in FIG. 5, even during the clipped output condition caused by excessive input signals. The operation locus $l_1$ is so set as will usually exist in an ASO region $l_3$ determined by a maximum allowable collector power loss (hyperbola $l_2$) of the output transistor $Q_4$, maximum allowable collector current Icmax, and a breakdown voltage $BV_{CEQ4}$ across the collector and emitter.

However, when the load $R_L$ is short-circuited or the power-supply voltage $V_{cc}$ is abnormally raised, the operation locus of the output transistor $Q_4$ falls outside the ASO region $l_3$, so that the output transistor $Q_4$ may be broken. Thus, just before the operation point of the output transistor $Q_4$ exceeds beyond the line $l_4$ connecting the two operation points $P_1$ and $P_2$, at which the protecting circuit starts to operate, the control transistor $Q_2$ is rendered conductive in accordance with the abovementioned relation (5) or (6), whereby the base current of the output transistor $Q_4$ is decreased to protect the output transistor $Q_4$.

As will be obvious from the current-limiting equation (5) or (6), since the forward voltage $V_{BE}$ across the base and emitter of the transistor whose characteristics depend much upon the temperature is not included in the current-limiting equation, it is possible to materialize a protecting circuit having a protecting operation initiating level which has no relation to the changes in junction temperature of the transistor.

Further, in the above protecting circuit, dispersion in the absolute value of resistance $R_3$, dispersion in the ratio of resistance $R_1$ to resistance $R_2$, and dispersion in the ratio of resistance $R_2$ to resistance $R_4$, are the only causes of dispersion in the level of initiating the protecting operation. Consequently, the abovementioned protecting circuit enables the width of dispersion to be reduced as compared with the conventional circuits. In other words, when the resistance $R_3$ is formed by an equivalent resistance (for example, 10 to 30 mΩ) by means of an aluminum wiring layer in a monolithic semiconductive integrated circuit, the dispersion in resistance can be reduced. It is further possible to greatly reduce the dispersion in the ratio of semiconductive resistance $R_1$ to semiconductive resistance $R_2$ formed in the monolithic semiconductive integrated circuit. It is therefore desired to form the protecting circuit shown in FIG. 1 in a monolithic semiconductive integrated circuit, and particularly to form the resistors $R_1$ and $R_2$ by way of semiconductive resistors, and to form the resistor $R_3$ in the form of an equivalent resistance of a wiring layer of aluminum.

Further, since the current-limiting equations (5) and (6) of the protecting circuit exhibit linear characteristics as mentioned earlier, it is allowed to easily set the operation level of the protecting circuit responsive to the operation locus (straight line) required for the output circuit.

Figure 2:
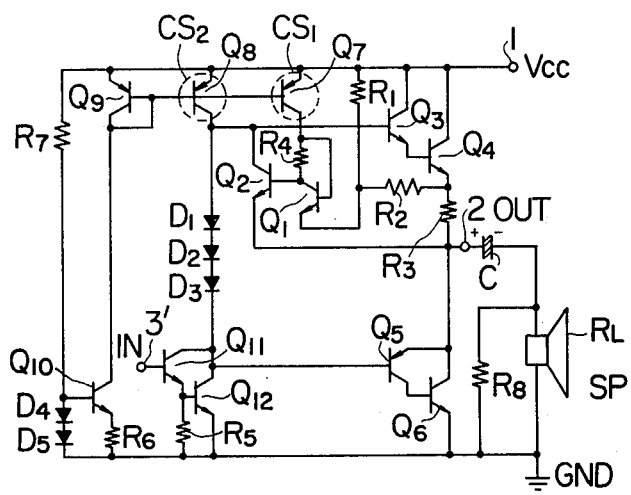
FIG. 2 is a circuit diagram of a push-pull output amplifier circuit to which is applied the protecting circuit of FIG. 1.
Figure 4:
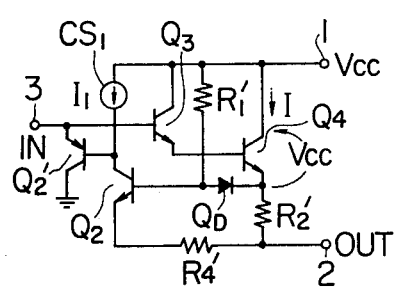

FIG. 2 is a circuit diagram when the protecting circuit of the embodiment of FIG. 1 is applied to a push-pull output amplifier circuit.

Symbols $Q_4$ and $Q_6$ represent output transistors. A d-c bias to the two output transistors has been so set that the voltage across the collector and emitter of each of them will be about Vcc/2 when no a-c signal is received. Transistors $Q_3$ and $Q_5$ work to amplify the input fed to a quasi-complementary push-pull output circuit.

The transistors $Q_1$, $Q_2$ and resistors $R_1$ to $R_4$ constitute a protecting circuit which was mentioned earlier in conjunction with FIG. 1, and a transistor $Q_7$ constitutes a constant-current circuit $CS_1$ which supplies the constant current Io to the resistor $R_4$.

A transistor $Q_8$ forms a constant-current circuit $CS_2$ which constitutes a load for drive transistors $Q_{11}$ and $Q_{12}$ which drive the push-pull output amplifier circuit.

A biasing circuit is constituted by diodes $D_1$ to $D_3$ which are inserted between bases of the input transistors $Q_3$ and $Q_5$ of the above output circuit.

The diodes $D_4$, $D_5$ and resistor $R_7$ constitute a constant-voltage circuit, and a transistor $Q_{10}$ which receives a forward constant voltage of diodes $D_4$, $D_5$ and an emitter resistor $R_6$ generate a constant current. The above-mentioned constant current Io is produced by a current mirror circuit in which the constant current is allowed to flow into a transistor $Q_9$, and the base and emitter of the constant-current transistors $Q_7$ and $Q_9$ are commonly connected.

A capacitor C, a resistor $R_8$ and a speaker SP constitute a load circuit.

The present invention should not be restricted to the abovementioned embodiment only; for instance, the current detecting resistor $R_3$ may be provided on the collector side of the output transistor $Q_4$.

In this case, a level shift transistor $Q_1$ and a control transistor $Q_2$ should be of the p-n-p type, and the constant-current circuits $CS_1$ and $CS_2$ should absorb constant current.

The protecting circuit of the present invention can be applied not only to the push-pull output circuit shown in FIG. 2, but also to various other types of circuits. In that case, the protecting circuit may be provided for both of the output transistors which perform complementary operation.

The input current to the output transistors $Q_3$ and $Q_4$ may be directly interrupted by the above transistor $Q_2$, or may be indirectly interrupted by means of a Schmidt trigger circuit or the like.

Figure 6:
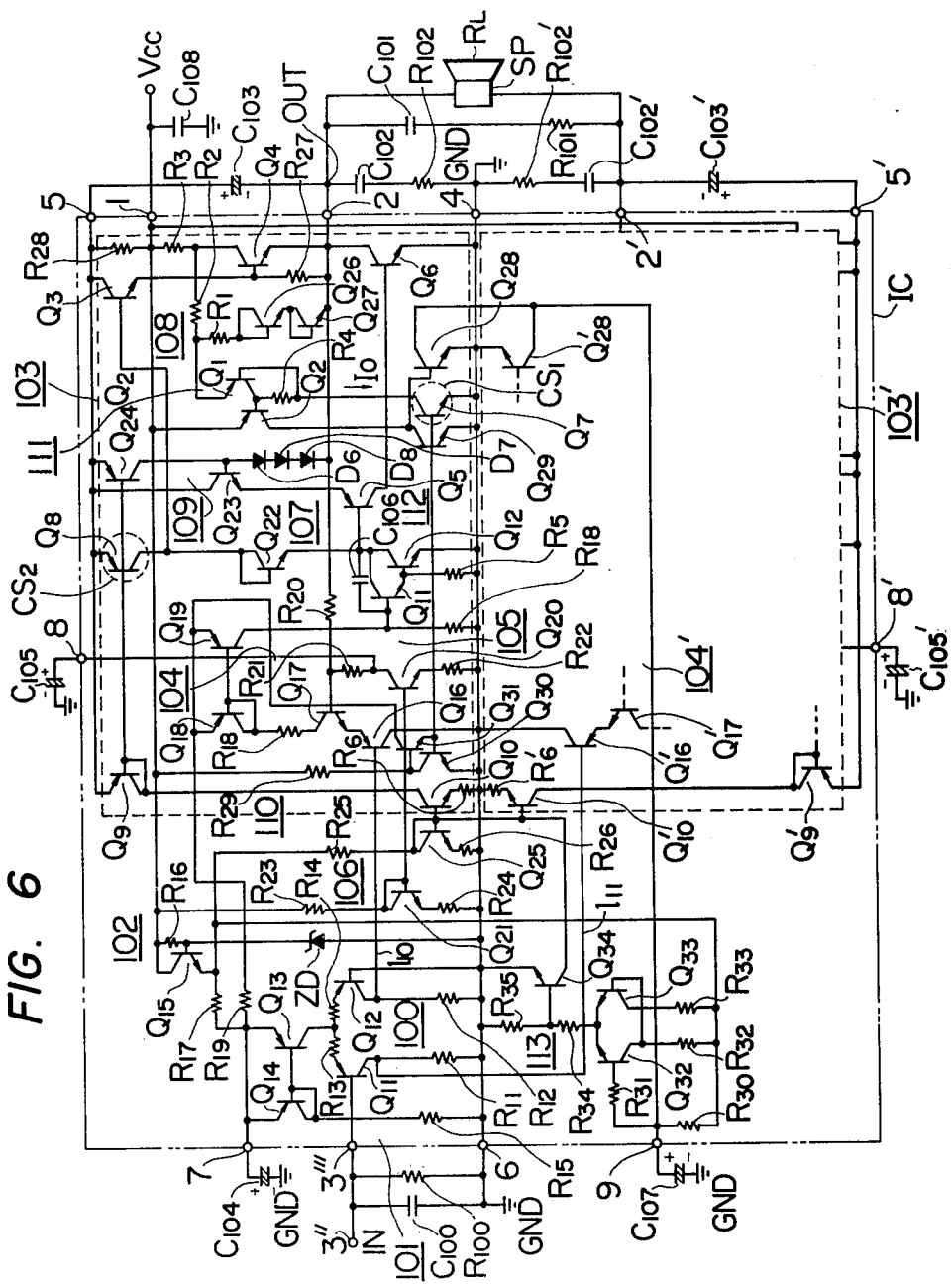
FIG. 6 is a circuit diagram of a BTL circuit according to which a push-pull output amplifier circuit by the modified embodiment of FIG. 2 is constructed in the form of a monolithic semiconductive integrated circuit.

FIG. 6 shows an embodiment in which the protecting circuit of the present invention is applied to a BTL (Balanced Transformer-Less) circuit made up of the push-pull output amplifier circuit in the form of a monolithic semiconductive integrated circuit according to the modified embodiment of FIG. 2.

The circuit elements surrounded by a two-dot-dash line have all been formed in a single silicon chip by way of a customary method of making semiconductive integrated circuits.

An input signal applied to an input terminal $3''$ is transmitted to an input terminal $3'''$ of the integrated circuit. A differential phase separator circuit 100 made up of transistors $Q_{11}$–$Q_{13}$ and resistors $R_{11}$–$R_{14}$, works responsive to the signals and produces two output signals of anti-phase relation to two signal lines $l_{10}$ and $l_{11}$. A value of constant current flowing through the constant-current transistor $Q_{13}$ of the differential phase separator circuit 100 is determined by a biasing current which flows in a biasing circuit 101 made up of a transistor $Q_{14}$ and a resistor $R_{15}$.

A constant-voltage Zener diode ZD, a resistor $R_{16}$ and a transistor $Q_{15}$ constitute a constant-voltage regulator 102 which generates an operation voltage of nearly a constant value irrespective of the power-supply voltage Vcc fed to the power-supply terminal 1.

The operation voltage is fed to the differential phase separator circuit 100 and to the biasing circuit 101 via a resistor $R_{17}$.

Reference numerals 103 and 103' represent a pair of power amplifier circuits of the BTL circuit for directly driving the speaker SP without interposing any output coupling capacitors. The pair of power amplifier circuits 103, 103' have been constructed quite in the same manner. Therefore, only one power amplifier circuit 103 is closely diagrammatized, and the other circuit 103' is not diagrammatized.

The speaker SP is directly connected between a pair of outputs 2, 2' of the pair of power amplifier circuits 103 and 103'.

To prevent the oscillation, a series circuit consisting of a capacitor $C_{101}$ and a resistor $R_{101}$ is connected in parallel with the speaker SP, a series circuit consisting of a capacitor $C_{102}$ and a resistor $R_{102}$ is connected between an output terminal 2 and a ground terminal 4, and further a series circuit consisting of a capacitor $C_{102'}$ and a resistor $R_{102'}$ is connected between an output terminal 2' and the ground terminal 4.

Bootstrap capacitors $C_{103}$ and $C_{103'}$ have been connected between output terminals 2, 2' and bootstrap terminals 5, 5', respectively.

The two signals sent onto the two signal lines $l_{10}$ and $l_{11}$ are applied to the bases of transistors $Q_{16}$, $Q_{16'}$ in initial-stage amplifier circuits 104, 104' of the pair of power amplifier circuits 103 and 103'.

Although not specifically restricted thereto, the initial-stage amplifier circuit 104 includes a modified differential amplifier circuit consisting of transistors $Q_{16}$, $Q_{17}$ and a resistor $R_{18}$, a current mirror circuit consisting of transistors $Q_{18}$ and $Q_{19}$, and a load consisting of the resistor $R_{18}$ as shown. A nearly constant operation voltage is applied by a constant-voltage regulator 102 to the initial-stage amplifier circuit 104 via a resistor $R_{19}$. One end of the resistor $R_{19}$ is connected to a filter capacitor $C_{104}$ for removing power-supply rippling via a terminal 7, whereby the differential phase separator circuit 101 is allowed to very stably operate.

An output OUT produced from an output terminal 2 of the power amplifier circuit 103 is transmitted to the base of the transistor $Q_{17}$ of the inital-stage amplifier circuit 104 via a negative feedback circuit 105 consisting of resistors $R_{20}$–$R_{22}$, a constant-current transistor $Q_{20}$, and a capacitor $C_{105}$ connected to a terminal 8, whereby an a-c voltage gain of the power amplifier circuit 103 is determined, and a d-c output voltage level at the output terminal 2 of the power amplifier circuit 103 is determined to acquire a value of nearly Vcc/2 as mentioned below.

That is to say, the base of the constant-current transistor $Q_{20}$ is biased by a biasing circuit 106 consisting of a transistor $Q_{21}$ and resistors $R_{23}$, $R_{24}$. Since the biasing circuit 106 has been connected to the power-supply terminal 1, a constant current which flows into the constant-current transistor $Q_{20}$ is dependent upon the power-supply voltage Vcc. Therefore, even when the power-supply voltage Vcc is varied, the d-c output level at the output terminal 2 follows the value Vcc/2 which varies responsive to the changes in the power-supply voltage Vcc.

On the other hand, the output signal of the initial-stage amplifier circuit 104 produced across the resistor $R_{18}$ is amplified by a drive amplifier circuit consisting of in Darlington-type connected transistors $Q_{11}$ and $Q_{12}$, a resistor $R_5$, a phase compensating capacitor $C_{106}$, a diode-connected transistor $Q_{22}$ and a constant-current load transistor $Q_8$. The output of the drive amplifier circuit 107 is fed to in Darlington-type connected transistors $Q_3$ and $Q_4$ in the push-pull output amplifier circuit 108, as well as to complementary-connected transistors $Q_5$ and $Q_6$.

The emitter of the transistor $Q_5$ is connected to an idling current adjusting circuit 109 made up of diodes $D_6$–$D_8$, and transistors $Q_{23}$ and $Q_{24}$, such that the crossover distortion of the push-pull output amplifier circuit 108 can be reduced.

The base of the constant-current load transistor $Q_8$ of the drive amplifier circuit 107 and the base of the transistor $Q_{24}$ of the idling current adjusting circuit 109 have been connected to the base of the transistor $Q_9$ of the biasing circuit 110. The biasing circuit 110 is composed of transistors $Q_{10}$, $Q_{25}$, and resistors $R_6$, $R_{25}$, $R_{26}$, and is operated by a nearly constant operation voltage from a constant-voltage regulator 102. Therefore, a d-c biasing current flowing into the drive amplifier circuit 107 and a d-c biasing current flowing into a push-pull output amplifier circuit 108 are maintained at nearly constant values despite the changes in power-supply voltage Vcc.

The resistors $R_1$ to $R_4$ and the transistor $Q_1$ constitute a detector circuit 111 which operates on the same operation principle shown in FIGS. 1 and 2. The detector circuit 111, however, is different from the embodiments of FIGS. 1 and 2, in regard to that the transistors $Q_1$ and $Q_2$ are of the p-n-p type, the diode-connected transistors $Q_{26}$ and $Q_{27}$ are connected in series with the resistor $R_1$, the current detecting resistor $R_3$ formed in the form of an equivalent resistance in the aluminum wiring layer is connected to the collector of the transistor $Q_4$, and the constant-current circuit $CS_1$ for producing the constant current Io has been constructed in the form of a constant-current absorbing circuit.

Another difference is that the collector of the control transistor $Q_2$ which is driven by the output of the detector circuit 111 is not connected to the base of the transistor $Q_3$ but is connected to the base of the transistor $Q_{29}$ of the biasing circuit 112. Further, the collector of the control transistor $Q_2$ has been connected to the base of another transistor $Q_{28}$.

The biasing circuit 112 is further composed of transistors $Q_{30}$, $Q_{31}$, and a resistor $R_{29}$, and is operated by the operation voltage Vcc of the power supply.

The collector of the transistor $Q_{28}$ in the power amplifier circuit 103 and the collector of the transistor $Q_{28'}$ in the power amplifier circuit 103' are connected to a capacitor $C_{107}$ via the terminal 9. Since the transistors $Q_{28}$ and $Q_{28'}$ are usually rendered non-conductive, the capacitor $C_{107}$ has been electrically charged up to an operation voltage of the constant-voltage regulator 102 via a resistor $R_{30}$.

The terminal 9, on the other hand, is connected to an input of a Schmidt trigger circuit 113 via a resistor $R_{31}$. The Schmidt trigger circuit 113 is constructed, as shown, by means of transistors $Q_{32}$, $Q_{33}$ and resistors $R_{32}$ to $R_{35}$. The output of the Schmidt trigger circuit will be obtained at a connection point between the resistor $R_{34}$ and the resistor $R_{35}$. The resistance of the resistor $R_{32}$ has been set to be, for example, 10 K$\Omega$ which is greater than the resistance (for example, 2 K$\Omega$) of the resistor $R_{33}$, such that the output of the trigger circuit acquires a low level when the capacitor $C_{107}$ has been electrically charged.

The detector circuit 111, on the other hand, has been so designed that a line $l_4$ for initiating the operation of the protecting circuit lies between the operation locus $l_1$ of the output transistor $Q_4$ and the line $l_3$ of the ASO region, like the case of FIG. 5.

Namely, the constant current Io which flows into the transistor $Q_7$ of the constant-current circuit $CS_1$ is given by the following relation.

$$Io = Vcc - (V_{BEQ30} - V_{BEQ31}) \quad (7)$$

where

Vcc represents a power-supply voltage Vcc, $V_{BEQ30}$ and $V_{BEQ31}$ represent forward voltages across the base and emitter of the transistors $Q_{30}$ and $Q_{31}$, and $R_{29}$ a resistance of the resistor $R_{29}$.

When the resistors $R_1$ to $R_3$ satisfy a requirement $R_1 >> R_2 >> R_3$, the voltage $V_{BEQ2}$ appearing across the base and emitter of the control transistor $Q_2$ is given by the following relation, like the equation (3) mentioned earlier, $$V_{BEQ2} \approx Ic_4 \cdot R_3 + (R_2/R_1)(V_{CEQ4} - V_{BEQ26} - V_{BEQ27}) + Io(R_2 - R_4) + V_{BEQ1} \quad (8)$$

where $V_{BEQ26}$ and $V_{BEQ27}$ represent forward voltages across the base and emitter.

From the above equations (7) and (8), $$V_{BEQ2} \approx Ic_4 \cdot R_3 + (R_2/R_1)(V_{CEQ4} - V_{BEQ26} - V_{BEQ27}) + (R_2 - R_4)/R_{29}\{Vcc - (V_{BEQ30} + V_{BEQ31})\} + V_{BEQ1} \quad (9)$$

The resistances have been set as mentioned below, so that the resistors $R_1$ to $R_3$ satisfy the requirement $R_1 >> R_2 >> R_3$, the resistors $R_2$ and $R_4$ satisfy the requirement $R_4 \approx 2R_2$, and the resistors $R_1$, $R_2$, $R_4$ and $R_{29}$ satisfy the requirement $R_2/R_1 \approx (R_2 - R_4)/R_{29}$, $R_1 = 10$ K$\Omega$ (semiconductive resistor), $R_2 = 100$ $\Omega$ (semiconductive resistor), $R_3 = 15$ m$\Omega$ (equivalent resistance in the layer of aluminum wiring), $R_4 = 200\Omega$ (semiconductive resistor), $R_{29} = 10$K$\Omega$ (semiconductive resistor).

Accordingly, if the base/emitter junction characteristics of the transistors $Q_{26}$ and $Q_{27}$ are equal to the base/emitter junction characteristics of the transistors $Q_{30}$ and $Q_{31}$, the current-limiting equation deriving from the equation (9) can be written as follows:

$$I_{c4} > \frac{R_2}{R_1 \cdot R_3}(Vcc - V_{CEQ4}) \quad (10)$$

As will be obvious from the current-limiting equation (10), the dispersion in base/emitter junction characteristics of the transistors $Q_{30}$ and $Q_{31}$ in the biasing circuit 112, and the temperature dependency, are cancelled by those of the transistors $Q_{26}$ and $Q_{27}$ in the detector circuit 111, whereby it is made possible to obtain a line for initiating the operation of the protecting circuit irrespective of the base/emitter junction characteristics of the transistors.

Quite in the same manner as the case of FIG. 5, just before the output of the output transistor of the power amplifier circuit 103 exceeds the line $l_4$ connecting the two operation points $P_1$ and $P_2$ for initiating the protecting operation, the transistor $Q_{28}$ is rendered conductive according to the equation (10), whereby the electric charge stored in the capacitor $C_{107}$ at the terminal 9 is discharged through the transistor $Q_{28}$. Hence, the output of the Schmidt trigger circuit 113 at a connection point between the resistor $R_{34}$ and the resistor $R_{35}$ acquires a high level to render the transistor $Q_{34}$ conductive.

The transistor $Q_{34}$ rendered conductive causes the transistors $Q_{25}$, $Q_{10}$ and $Q_9$ in the biasing circuit 110 to be nonconductive. Therefore, since the transistor $Q_8$ constituting the constant-current load $CS_2$ of the drive amplifier circuit 107 is rendered nonconductive, the transistors $Q_3$ and $Q_4$ of the push-pull output amplifier circuit 108 are rendered nonconductive.

Since the transistor $Q_9$ of the biasing circuit 110 has also been rendered nonconductive, the transistor $Q_{24}$ of the idling current adjusting circuit 109 is rendered nonconductive, and the transistors $Q_5$ and $Q_6$ of the push-pull output amplifier circuit 108 are rendered nonconductive, as well.

Thus, the base currents of the output transistors $Q_4$ and $Q_6$ of the push-pull output amplifier circuit 108 are interrupted, making it possible to prevent them from being destroyed.

What is claimed is:

1. In a protecting circuit comprising; means connected across the collector and emitter of a transistor that is to be protected thereby to detect a voltage across the collector and emitter of said transistor that is to be protected, current-detecting means connected in series with the collector-emitter current path of said transistor that is to be protected thereby to detect a collector current or an emitter current of said transistor that is to be protected, a detector transistor that will be driven with voltage produced by said two means, a constant-current circuit for supplying a constant current to said detector transistor, and a control transistor of which the base is driven by the collector output of said detector transistor thereby to directly or indirectly control the base of the transistor that is to be protected, the improvement characterized in that a first resistor and a second resistor are connected in series between the collector and emitter of said transistor that is to be protected thereby to constitute said means for detecting the voltage between said collector and emitter, an end of a third resistor that serves as said current detecting means is connected to the collector or the emitter of said transistor that is to be protected, other end of said third resistor is connected to the emitter of said control transistor, a connection point between said first resistor and said second resistor is connected to the emitter of said detector transistor, a fourth resistor is connected across the collector and base of said detector transistor, one end of said fourth resistor connected to the base of said detector transistor is connected to said constant-current circuit, and other end of said fourth resistor connected to the collector of said detector transistor is connected to the base of said control transistor.

2. A protecting circuit as set forth in claim 1 wherein a resistance of the first resistor is sufficiently greater than that of the second resistor, and the resistance of said second resistor is sufficiently greater than that of the third resistor.

3. A protecting circuit as set forth in claim 2 wherein the resistance of the third resistor is set by an equivalent resistance of a wiring layer in a semiconductive integrated circuit.

4. A protecting circuit as set forth in claim 3 wherein the resistances of the first, second, third and fourth resistors, and a value of constant current of said constant-current circuit are so selected that a straight line for initiating the protecting operation lies between an operation locus of said transistor that is to be protected and an ASO region determined by the collector/emitter voltage-collector current characteristics of said transistor that is to be protected.

5. A protecting circuit as set forth in claim 4 wherein the constant current of said constant-current circuit is determined by a biasing circuit including a resistor and a transistor which are connected in series between the power-supply voltage and a point of reference potential, and the base/emitter junction characteristics of said transistor of said biasing circuit are cancelled by the base/emitter junction characteristics of another transistor connected in series with said first resistor.

6. A protecting circuit as set forth in claim 5, wherein a resistance of said resistor in said biasing circuit is selected to be equal to the resistance of the first resistor in said protecting circuit, and a resistance of said fourth resistor is selected to have a resistance which is about two folds of the resistance of said second resistor.

* * * * *